United States Patent [19]

Bode

[11] 4,377,961
[45] Mar. 29, 1983

[54] FUNDAMENTAL FREQUENCY EXTRACTING SYSTEM

[76] Inventor: Harald E. W. Bode, 1344 Abington Pl., North Tonawanda, N.Y. 14120

[21] Appl. No.: 254,003

[22] Filed: Apr. 13, 1981

Related U.S. Application Data

[63] Continuation-in-part of Ser. No. 74,228, Sep. 10, 1979.

[51] Int. Cl.³ .................... G10H 1/00; G01R 23/65
[52] U.S. Cl. .................................. 84/1.01; 84/1.24;
   84/454; 84/DIG. 18; 324/77 E; 324/78 F
[58] Field of Search .................. 84/1.01, 454, DIG. 8,
   84/1.24; 324/77 E, 78 R, 78 D, 78 F; 307/105,
   261; 330/110; 179/15 A, 15 C

[56] References Cited

U.S. PATENT DOCUMENTS

| | | | |
|---|---|---|---|
| 3,364,425 | 1/1968 | Peterson et al. | 324/77 E |
| 3,395,345 | 7/1968 | Rader | 324/77 E |
| 3,439,122 | 4/1969 | Coker | 324/77 E |
| 3,766,818 | 10/1973 | Prohofsky | 84/454 |
| 3,901,120 | 8/1975 | Youngquist | 84/454 |
| 4,077,298 | 3/1978 | Kondo | 84/454 |
| 4,280,387 | 7/1981 | Moog | 324/78 F |

OTHER PUBLICATIONS

Millman and Halkias, Integrated Electronics, 1972, pp. 572–573.
Lancaster, Active Filter Cookbook, 1975, p. 14.

*Primary Examiner*—J. V. Truhe
*Assistant Examiner*—Forester W. Isen
*Attorney, Agent, or Firm*—Martin Lukacher

[57] ABSTRACT

A system for extracting the fundamental frequency or pitch of complex waves such as voice, musical instruments or other audio signals. Separate channels extract the fundamental frequency component when it is present in successively wider frequency bands, the frequency intervals between which are equal or less than an octave. Control signals generated in response to the presence of the fundamental components in any lower frequency channel inhibit each of the higher frequency channels thereby reducing the possibility of an overtone being detected as a fundamental frequency component of the complex wave.

13 Claims, 5 Drawing Figures

1

FUNDAMENTAL FREQUENCY EXTRACTING SYSTEM

This application is a continuation in part of my application Ser. No. 74,228, filed Sept. 10, 1979.

DESCRIPTION

The present invention relates to systems for extracting or selecting the fundamental frequency or pitch of a complex wave, and particularly to a system for extracting the pitch of the spoken or singing voice or of an instrument as it is played.

The present invention is especially suitable for use in electronically enhancing music by providing tones which follow the fundamental frequency or pitch of the music and have the same pitch or a pitch related thereto.

Complex waves such as audio signals produced by a vocalist or instrumentalist are exceedingly rich in overtones. When it is desired to extract or select the fundamental frequency or pitch of the audio, it is necessary not to respond to any of the overtones.

It is therefore a principal object of this invention to provide an improved system for extracting the fundamental frequency component of a complex wave such as the pitch of a voice or of an instrument or other acoustical signal in which the response of the system to overtones, rather than the fundamental frequency of the complex wave, is reduced.

It is another object of the invention to provide a system for producing an output signal of frequency which follows the fundamental frequency of a complex wave such as the pitch of acoustical signals of a vocalist or instrumentalist in which response to overtones is reduced.

It is a feature of this invention to provide a system in which the presence of a lower frequency signal which may correspond to the fundamental frequency of an input complex wave is used to silence, squelch, gate out or otherwise suppress any higher frequency waves in order to eliminate unwanted overtones and to provide an output exclusively containing the fundamental frequency component of the wave.

Briefly described, a system for extracting the fundamental frequency component of a complex wave in accordance with the invention makes use of means for detecting the fundamental component of the wave when it is present in any of a plurality of successively wider bands of frequency, each of these bands is wider than the preceding band by a frequency increment not exceeding an octave of the highest frequency of the preceding band. To this end a number of channels with low pass filters may be provided. The filters have cutoff frequencies which are successively higher, with the frequency increment of the highest frequencies in adjacent channels being an octave or less of the next lower channel filter. Means responsive to the detection of the component in any of the bands which are wider in frequency. For example, control voltage generators associated with each of the channels obtain from the lowest frequency channel which passes a signal (that channel being the one that passes the fundamental frequency component), a control voltage which gates out or otherwise inhibits the higher frequency channels.

More specifically, the features of the invention may be obtained by reason of the use of some or all of:

(1) an array of frequency selective channels containing low pass filters which cover successively wider bands which increase in frequency by intervals not exceeding an octave, at least, as many channels being provided as the number of octaves in which the fundamental frequency to be extracted may exist;

(2) means for deriving control voltages at the low pass filter outputs of all but the highest frequency channel;

(3) means, such as gates, in all but the lowest frequency channel for inhibiting the detection of the fundamental frequency component in all but that lowest frequency channel;

(4) means for routing the control voltage derived in the lowest frequency channel in which a signal is detected, for actuating the gates to inhibit all such higher frequency channels;

(5) distorting means, such as half wave rectifiers, at the input of each low pass filter in each channel to derive the fundamental frequency as from input waves with strongly emphasized formants;

(6) an output circuit such a summing circuit connected to each channel at the output of which the selected fundamental frequency component is provided;

(7) an output gate which is enabled only after the fundamental frequency component is extracted (viz., a certain delay time after the input wave is applied to the system), and (8) a voltage controlled oscillator which provides a tone related to the extracted fundamental frequency and can be at the same frequency or separated from the fundamental frequency by a frequency interval lower or higher than the fundamental frequency.

The foregoing and other objects, features and advantages of the invention will become more apparent from a reading of the following description in connection with the accompanying drawings, in which.

Figure 1:
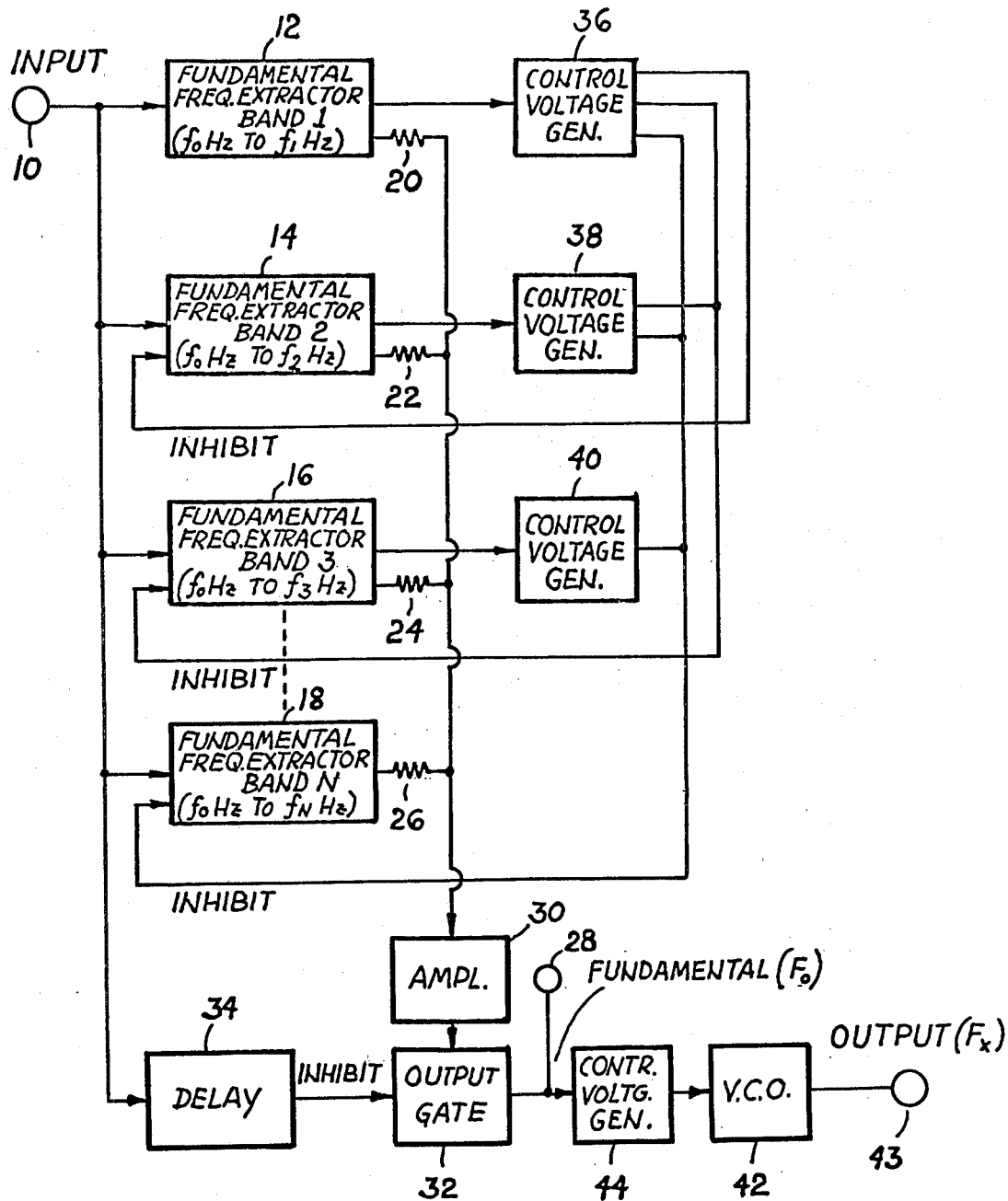
FIG. 1 is a block diagram of a fundamental frequency extracting system in accordance with an embodiment of the invention.

Referring first to FIG. 1, the input signal to the system is applied to the input terminal 10, as from an amplifier connected to a microphone which picks up the sound from the performing vocalist or instrumentalist. This input terminal is connected to a plurality of channels 12, 14, 16 and 18. Each of these channels contains a separate fundamental frequency extractor which selects the fundamental frequency when it is present in bands which are successively wider in frequency. The first or lowest frequency extractor for band 1 covers the band from 0 Hz to $f_1$ or from the lowest frequency chosen for the system, identified as $f_0$ Hz to $f_1$ Hz, where, for instance, $f_0$ may be not 0 Hz but 50 Hz to make the system less sensitive to ambient rumble or the like, which might produce wrong readings. The fundamental frequency is selected by the band 2 selector in the adjacent channel 14, when that fundamental frequency is between $f_0$ Hz and $f_2$ Hz. The third channel covers the third successive band, band 3, which extends from $f_0$ to Hz to $f_3$ Hz. A number of other channels may be provided. In general, the highest frequency in which the fundamental frequency is expected, $f_N$ Hz, is covered by the band N extractor which is contained in the highest frequency channel 18, which covers the band from $f_0$ Hz to $f_N$ Hz. In order to avoid overtones to be mistaken as the fundamental frequency, the difference between the highest frequencies of adjacent channels is less than an octave of the lower frequency one of the adjacent channels. Thus, where the highest frequencies of the bands are $f_1, f_2, f_3, \ldots f_{N-1}, f_N$, as shown in FIG. 1, the frequency increment or difference between the highest frequencies of the bands in adjacent channels does not exceed an octave. Stated mathematically $(f_2-f_1) \leq f_1, (f_3-f_2) \leq f_2 \ldots (f_N-f_{N-1}) \leq f_{N-1}$.

Consider for example the case where there are four channels where $f_1, f_2, f_3$ and $f_N$ are 150 Hz, 300 Hz, 600 Hz and 1200 Hz respectively. If the fundamental frequency component of the input wave is above 150 Hz, the first channel 12 becomes inactive and the second channel would extract the fundamental frequency, if that frequency was below 300 Hz. Similarly, higher fundamental frequencies would be extracted in the third or fourth channels 16 or 18 depending upon the frequency. In this example, the increment between adjacent frequencies is one octave of the highest frequency of the lower band and a second harmonic overtone may not be sufficiently suppressed. To this end it is preferable to reduce the frequency increment somewhat below an octave. The highest frequencies of the bands may suitably be, as shown in FIG. 2, 120, 200, 320, 540, 900, and 1500 Hz; six succcessively wider bands being provided.

The outputs of each of the extractors in each of the channels 12, 14, 16 and 18 are connected to isolating or summing resistors 20, 22, 24 and 26, to the fundamental ($F_0$) output 28 of the system via an amplifier 30 and an analog gate 32. A delay circuit 34, which may include a threshold sensitive device such as a trigger circuit, provides an inhibit input to the gate for a predetermined time at the beginning of each complex wave, such as a formant of voice or a continuous passage of music. Until the delay interval expires, the gate 32 is inhibited and the output to the terminal 28 is suppressed or switched off. This avoids pitch uncertainties until after the completion of the fundamental frequency selection in the extractors of the channels 12, 14, 16 and 18.

In order to reduce the possibility that an overtone (viz, a harmonic) is selected instead of the true fundamental frequency component, control voltage generators 36, 38 and 40 are connected to the output of the extractors in each channel except for the channel covering the highest frequency band. Control voltages are obtained from the lowest frequency channel that carries a signal. This is the channel that passes the fundamental frequency component. The control voltages are routed from the generator 36 which is connected to the lowest frequency channel to inhibit all of the higher frequency channels; for example by inhibiting or switching off the input to the extractors for the higher frequency bands, viz., bands 2, 3, . . . N. Similarly, the control voltage generator for the band next to the lowest frequency band is connected to inhibit the channels for the higher bands, which are shown as bands 3, . . . N. The control voltage generator 40 produces control voltages which inhibit the still higher frequency channels (viz., the band N channel 18). Accordingly, only the lowest frequency channel which extracts a signal is activated and operative to provide an output and this output is the fundamental frequency component of the input wave. The fundamental frequency component is therefore clearly defined and the system response to any overtones is reduced.

While it may be desired to use the fundamental frequency component directly by connecting an amplifier or sound reproduction system to the output terminal 28, it may also be desirable, in order to further define the fundamental frequency, to regenerate it by means of a voltage controlled oscillator 42. A control voltage generator 44 converts the frequency into a control voltage which varies the frequency of the voltage control oscillator so that it tracks the fundamental frequency. The control voltage generator may be a frequency discriminator, such for example as a voltage limiter (clipper) followed by a full wave rectifier. The full wave rectifier then provides a voltage corresponding to the DC value of the fundamental frequency signal which, is proportional to the frequency thereof. The control voltage generator may also be a known circuit for frequency to voltage conversion, such as a phase locked loop.

It may however be desired to provide an output frequency (indicated as $F_x$ at the output terminal 43) of the voltage controlled oscillator which is related to the fundamental frequency, but is not exactly equal thereto. The voltage controlled oscillator for example may operate at a frequency increment higher or lower than the fundamental frequency or may be a function of the fundamental frequency as may be determined by a function generator connected to, or as a part of, the voltage generator 44.

Figure 2:
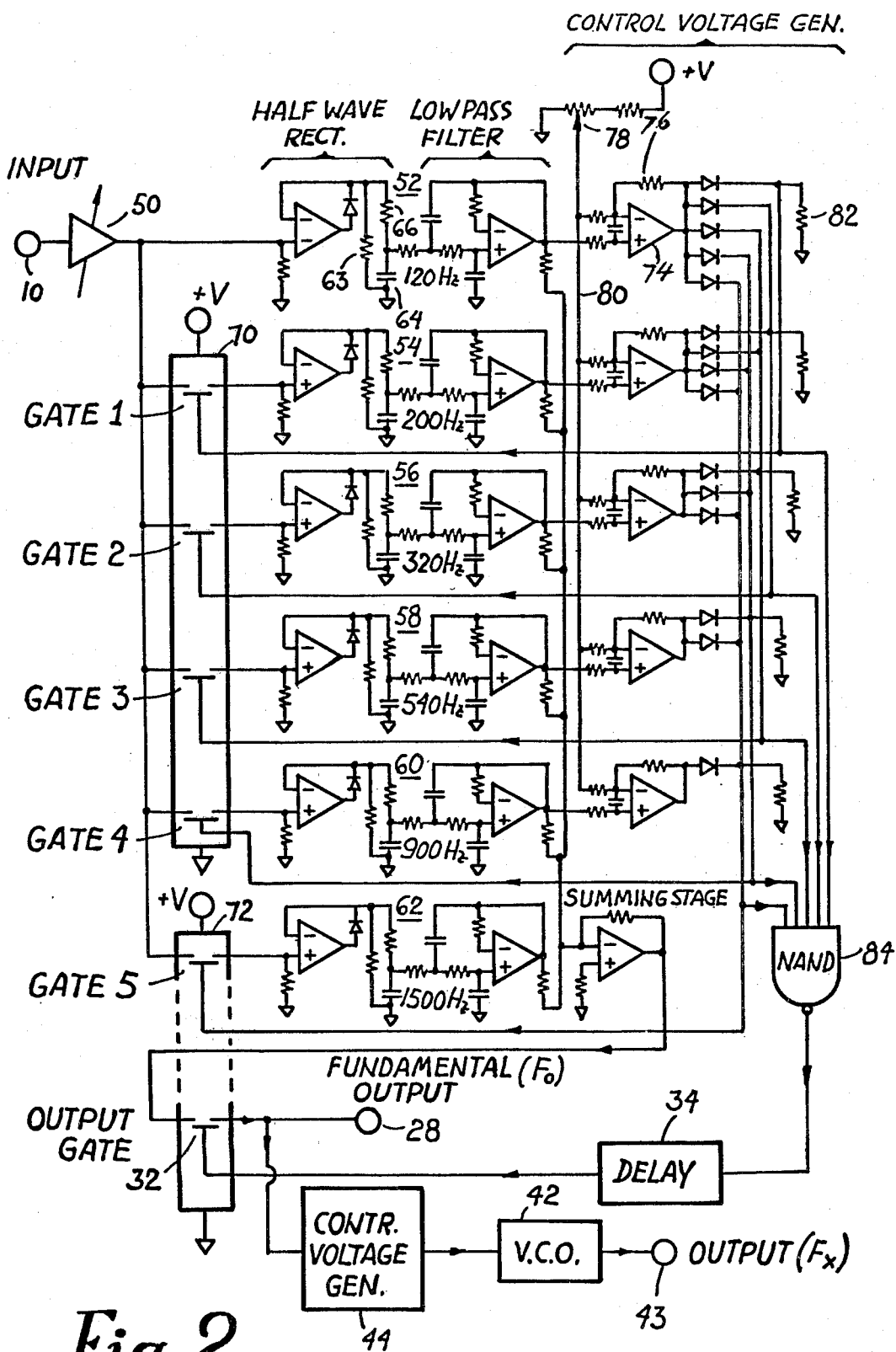
FIG. 2 is a more detailed diagram showing an embodiment of the system illustrated in FIG. 1.

Referring next to FIG. 2, the input wave is applied to the input terminal 10. A variable gain amplifier 50 may be provided for signal level adjustment. The output of this amplifier is connected to fundamental frequency extractors in five separate channels 52, 54, 56, 60 and 62, which cover successively wider frequency bands. As discussed above by way of example, the frequency increments between the highest frequency in each of these bands is less than an octave of that highest frequency. In the example shown in FIG. 2 the band covered by the first channel 52 is from 0 to 120 Hz. The band covered by the second channel 54 is 0 to 200 Hz. The band covered by the third channel 56 is 0 to 320 Hz. The fourth channel 58 covers the band from 0 to 540 Hz. The fifth channel 60 covers the band from 0 to 900 Hz, and the sixth channel 62 covers the band from 0 to 1500 Hz. Accordingly fundamental frequencies from 0 to 1500 Hz may be selected in this example.

The fundamental frequency selectors in each channel are all similar and contain a half-wave rectifier followed by a low pass filter. The half-wave rectifier is provided by an operational amplifier having direct and inverting inputs and a feedback loop from the output to the inverting input through a diode. The input signals are applied to the direct input and half-wave rectified signals are obtained and applied to a filter circuit consisting of a resistor 63 connected in parallel with a capacitor 64 through another resistor 66 (shown for channel 52 which is typical). The resistor 66 may be of relatively low value, such as a 100 ohms in order to suppress any relaxation oscillations. The half-wave rectifier functions as a distorting means which emphasizes or restores the fundamental frequency of waves, particularly those with a strong formant. A full wave rectifier is of course undesirable since it would generate the second harmonic rather than the fundamental frequency component itself, as in case of receiving a sine wave input. The resistor 63 and capacitor 64 define a low pass filter and the values of this resistor and capacitor are chosen to provide a cutoff frequency equal to the highest frequency in the band which is to be passed by the particular channel. In the case of the lowest frequency channel 52, this frequency is 120 Hz. In order to provide even more low pass selectivity, an active low pass filter is connected to the output of the filter provided by the resistor 63 and capacitor 64. This low pass filter is preferably an active filter utilizing a second operational amplifier.

The outputs of the low pass filters are connected through summing resistors to a summing stage which preferably has gain and provides amplification of the selected fundamental frequency component. The output of the summing stage then passes through the output gate 32 to the fundamental output terminal 28. A voltage controlled oscillator 42 controlled by a control voltage generator 44 may provide an output at terminal 43 which is related to the fundamental frequency component as discussed in connection with FIG. 1. At the inputs of each of the channels are gates provided by separate field effect transistors. These field effect transistors are part of an integrated circuit or solid state analog switch 70. This switch contains four gates. Since six gates are needed in the illustrated system, another analog switch circuit 72 is provided. These circuits may be of the type available from Intersil, Inc. of Cupertino, Calif., 95014, their type No. 1H505213 and other types such as CD 4016 of RCA. The gates indicated as gates 1 through 5 are provided at the input of each channel except the lowest frequency channel 52. All of the channels except the highest frequency channel 62 has its output connected to a control voltage generator provided by a comparator 74. The low pass filter is connected to the inverting input of the comparator. The comparator has a high value feedback resistor 76 connected between the output and the direct input thereof such that it acts like a Schmidt trigger. A threshold level is applied from a potentiometer 78 to the direct input of the comparator. The same threshold voltage is applied by way of a bus 80 to the direct inputs of all of the comparators for all of the channels. The output of the low pass filters, which is further ripple filtered by the capacitor and the resistors connected at the input of each comparator, 74, causes the comparator to provide a negative output voltage. In the absence of a signal from the low pass filter connected thereto, the output of the comparator is positive. Diodes connected to the output of the comparators route the control voltage to the gates of the higher frequency channels. Positive control voltage which is present in the absence of a low pass filter output enables the gates. However, a negative control voltage is blocked by the diodes and ground potential is then applied to the gates which inhibits the gates. Accordingly all of the channels except the lowest frequency channel which carries a signal passed by the low pass filter thereof are inhibited. While the use of sensitive comparators as control voltage generators is preferred, other circuits for generating control voltages such as full wave rectifiers, may be used.

In order to insure that a fundamental frequency component is detected, the output gate 32 is inhibited by a NAND gate 84 until one of the inputs thereof goes low which is indicative of the detection of the fundamental frequency component by one of the channels. Then, after a delay in the delay circuit 34, the output gate 32 is enabled.

Figure 3:
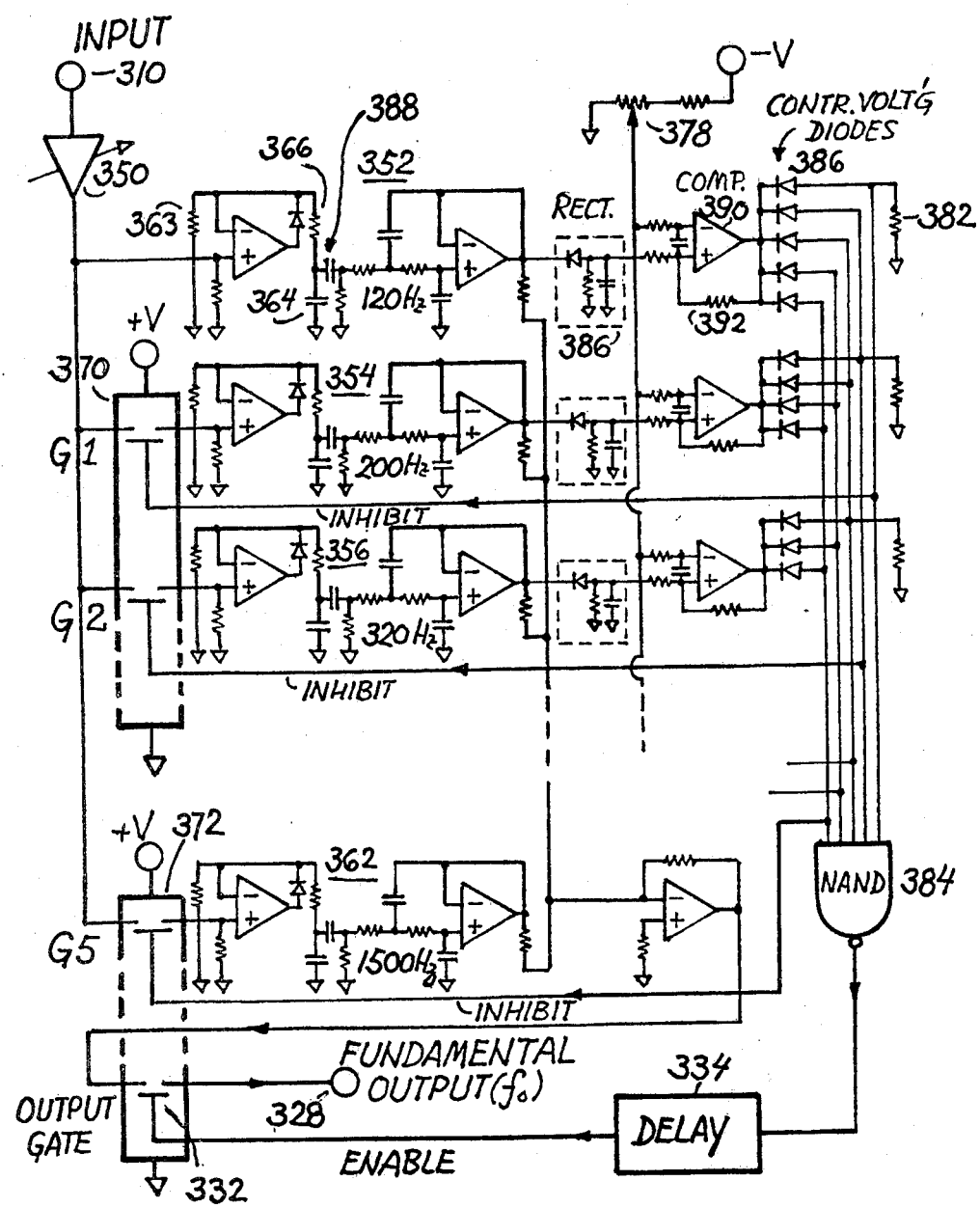
FIG. 3 is another more detailed diagram showing another embodiment of the system illustrated in FIG. 1.
Figure 4:
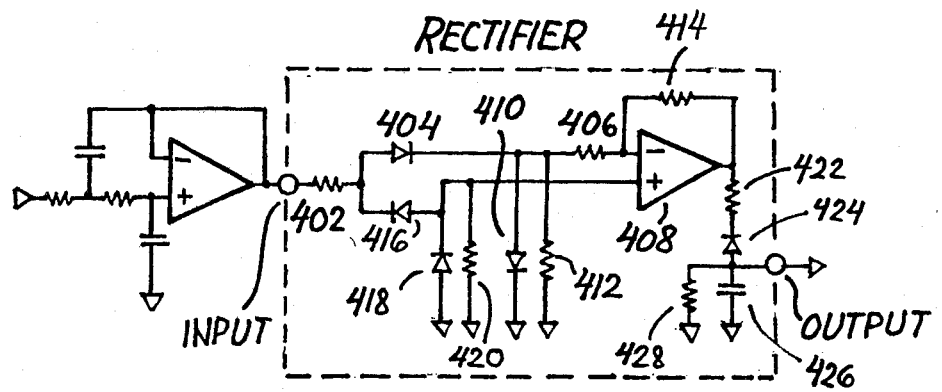
FIG. 4 is a schematic diagram of an alternate rectifier which may be used in the system shown in FIG. 3.

Referring to FIG. 3, there is shown a system similar to FIG. 2, but with A.C. coupling from the predistortion, half wave rectifiers to the filters. In order to have an A.C. signal in the low pass filters 352, 354, 356 through 362, a decoupling capacitor 388 is connected between the distorting input stages (half wave rectifier) 364 and the low pass filters 352, 354, 356, . . . , 362. As discussed above, the purpose of this predistortion is to reconstruct a missing fundamental from a sound with strong harmonic overtones thereof by rectification and subsequent low pass filtering through resistor 366 and capacitor 364. In a typical channel, the reconstructed fundamental is low pass filtered in the low pass filter stage 352 and subsequently rectified in the rectifier 386, symbolically shown in FIG. 3 as a half wave rectifier. It will be understood, that a full wave rectifier could be used, such as shown in FIG. 4. The control voltage generated in the rectifier 386 enters through a resistor of medium size (typically 10 kohm) the non-inverting input of the comparator 390, the inverting input of which is connected through a resistor of the same size to a bus 378 carrying a slightly negative bias voltage. Thus, in the quiescent state the output of comparator 390 will be positive, and no current will flow through the diodes 386 and the bleeding resistors, typically represented by the resistor 382, to ground. A high value feedback resistor 392 from the comparator output to its non-inverting input (for instance 1 megohm) causes the comparator 390 to act as a Schmidt Trigger and to maintain its output state until a sufficient negative control voltage level is generated in rectifier 386. After such a control level is reached, the output voltage of the comparator 390 flips over to the negative state, and the negative potential is conducted to at least one of the inputs of the NAND gate 384.

Considering the performance of the 120 Hz channel (chosen as an example), the negative control voltages, passing the group of the 5 diodes shown at the output of comparator 390, reach the gates G1, G2, . . . G5 and inhibit these gates so that no signals will reach the subsequent circuitry in the higher frequency channels. The reference potential to the NAND gate 384 (not shown) is held negative so that its inputs are positive and its output negative in the quiescent state. Due to its typical performance its output will become positive, when any of its inputs become negative.

Figure 5:
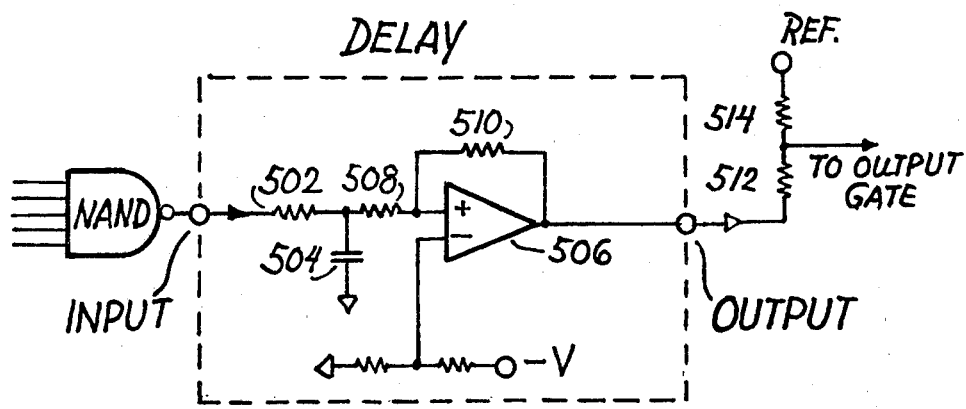
FIG. 5 is a schematic diagram of the delay circuit shown in FIG. 3.

The output of the NAND gate 384 is connected to the input of the DELAY circuit, identified with numeral 334 in FIG. 3. A suitable configuration of this delay circuit is shown in FIG. 5. The input of this delay circuit is connected to the output of the NAND gate. The delay circuit comprises an input resistor 502 and a capacitor 504. This R/C combination forms a time constant element determining the speed, at which the DC potential change from the NAND gate becomes effective at the non-inverting input of the comparator 506. The input resistor 508 and the positive feedback resistor 510 are optional and may convert this comparator into a Schmidt Trigger. The typical component values may be, for instance, 20 Kohm for resistor 502, 1.0 mfd for capacitor 504, 10 Kohm for resistor 508 and 1 Megohm for resistor 510. The negative bias voltage provided for the inverting input of the comparator 506 is chosen so as to interface the level of the delay circuit to the operating levels received at the output of the NAND gate. The control voltage received at the output of the comparator 506 may be applied to a voltage divider formed of the resistors 512 and 514, the latter resistor 514 being connected to a reference potential, in order to derive the correct voltage level required for the control electrode of the output gate.

Referring to FIG. 4, the input to the full wave rectifier shown therein is connected to the output of a low pass filter (typically represented by 352 in FIG. 3). The input resistor 402 (for instance 2.2 Kohm) is provided to prevent excessive loading of the operational amplifier output of the low pass filter. The input resistor is followed by diode 404 and resistor 406 connected to the inverting input of an operational amplifier 408. Positive half waves from the circuit input are limited in voltage level, say to about +0.6 volts, depending upon the type of diode 410 used. The cathode of the diode 410 is connected to ground potential. At negative half waves, resistor 412 provides a ground reference potential for the inverting input of the amplifier 408 through resistor 406. Typically, resistor 412 may be 20 Kohms and resistor 406 may be 200 Kohms. A negative feedback resistor 414 (for instance 4.7 Megohms) is provided to determine the gain of the amplifier 408, which in case of the above mentioned exemplary component values would be 23.5. In addition to the branch leading to the inverting input of the operational amplifier 408, the branch comprising diode 416 and resistor 420 leads to the non-inverting input of the amplifier 408. At negative half waves from the circuit input, diode 416 becomes conductive, and the negative half wave is limited to about 0.6 volts, depending upon the type of shunt diode 418. Resistor 420 provides a reference potential to the non-inverting input of amplifier 408, when no current is flowing through diodes 416 and 418. Evidently the positive (flattened) half waves arriving at the inverting input of the amplifier 408 are amplified and inverted to provide negative flattened half waves at the output. The negative flattened half waves arriving at the non-inverting input of the amplifier 408 appear as amplified non-inverted (hence negative) flattened half waves at the output. The output signal of 408 is fed through a protective resistor 422 (for instance 1 Kohm) and a diode 424 to the output. Capacitor 426 (typically 0.22 mfd) serves as spike suppressor and resistor 428 (typically 100 Kohm or less) as a means to provide a reference potential in the quiescent state.

From the foregoing description it will be apparent that there has been provided an improved system for selecting the fundamental frequency component of a complex wave. Modifications and variations of the hereindescribed system will undoubtedly suggest themselves to those skilled in the art. The foregoing description should be taken merely as illustrative and not in any limiting sense.

I claim:

1. A system for extracting the fundamental frequency component of a complex wave such as the pitch of a voice or of an instrument, which system comprises a plurality of channels each having a single means for detecting the fundamental component of said wave when it is present in any of a plurality of successively wider bands of frequency, each being wider than its preceding band by a frequency increment not exceeding an octave of the highest frequency of the preceding band, and means responsive to the detection of said fundamental component in each of said bands for generating a control signal, a plurality of gating means for applying said control signal through separate ones of said gating means, to each of said channels for said bands of frequency higher than the channel generating said control signal for inhibiting the detection of said fundamental component in each and all of said higher frequency bands.

2. The invention as set forth in claim 1 wherein said detecting means comprise a plurality of fundamental frequency extractor means which are responsive to said fundamental component in said successively wider bands having highest frequencies of $f_1, f_2, f_3 \ldots f_{N-1}, f_N$ where said increment, $(f_2-f_1), (f_3-f_2), \ldots (f_N-f_{N-1})$ does not exceed said octave such that $(f_2-f_1) \leq f_1, (f_3-f_2) \leq f_2 \ldots (f_N-f_{N-1}) \leq f_{N-1}$.

3. The invention as set forth in claim 2 further comprising a plurality of channels each having a separate one of said extractor means therein, and said extractor means having low pass filter means having cutoff frequencies of said frequencies $f_1, f_2, f_3 \ldots f_{N-1}, f_N$ respectively in different ones of said channels.

4. The invention as set forth in claim 3 wherein each of said extractor means has, at the input of the low pass filter thereof, means for distorting said wave to derive the fundamental frequency component thereof.

5. The invention as set forth in claim 4 wherein said distorting means comprises means for half wave rectifying said wave.

6. A system for extracting the fundamental frequency component of a complex wave such as the pitch of a voice or of an instrument, which system comprises a plurality of channels each having means for detecting the fundamental component of said wave when it is present in any of a plurality of successively wider bands of frequency, each being wider than its preceding band by a frequency increment not exceeding an octave of the highest frequency of the preceding band, means responsive to the detection of said fundamental component in each of said bands of frequency lower than any other of said bands for generating a control signal and applying said control signal to each of said channels for said other bands inhibiting the detection of said fundamental component in each of said other bands, said detecting means comprising a plurality of fundamental frequency extractor means which are responsive to said fundamental component in said successively wider bands having highest frequencies of $f_1, f_2, f_3 \ldots f_{N-1}, f_N$ where said increment, $(f_2-f_1), (f_3-f_2), \ldots (f_N-f_{N-1})$ does not exceed said octave such that $(f_2-f_1) \leq f_1, (f_3-f_2) \leq f_2 \ldots (f_N-f_{N-1}) \leq f_{N-1}$, a plurality of said channels each having a separate one of said extractor means therein, and said extractor means having low pass filter means having cutoff frequencies of said frequencies $f_1, f_2, f_3, \ldots f_{N-1}, f_N$ respectively in different ones of said channels, said inhibiting means comprising means operatively connected in each of said channels at the output of the extractor means thereof, except for said channel having said low pass filter means of cutoff frequency $f_N$ therein, for generating control voltages upon detection of the fundamental frequency component within the band passed by the low pass filter means therein, and means for applying said control voltages from each of said channels having low pass filter means of cutoff frequency lower than any other of said channels to each of said other channels for inhibiting said other channels.

7. The invention as set forth in claim 6 further comprising means connected to said extractor means in each of said channels for summing the outputs thereof to provide said fundamental frequency component.

8. The invention as set forth in claim 7 further comprising means connected to the output of said summing means and responsive to said fundamental frequency component for providing a control voltage related to the frequency of said fundamental component, and voltage controlled oscillator means responsive to said control voltage for providing a signal of frequency related to the frequency of said fundamental component.

9. The invention as set forth in claim 6 wherein said each of said control voltage generator means comprises comparator circuit means for providing said control voltage when the one of said extractor means connected thereto provides an output exceeding a certain threshold level, and wherein said control voltage applying means comprises gate means at the input of each of said channels except the one of said channels with the one of said low pass filter means having the lowest of said cutoff frequencies, and means connecting said comparator means of each of said channels to the gate means of each of said other of said channels having a low pass filter means of higher cutoff frequency to apply said control voltage to said gate means of said other channels for inhibiting said other channels.

10. The invention as set forth in claim 9 further comprising means connected to said extractor means in each of said channels for summing the outputs thereof, gate means connected to the output of said summing means, means responsive to the presence of an output from at least one of said comparator means for operating said gate means which is connected to the output of said summing means to inhibit the provision of said fundamental frequency component from the output of said summing means.

11. The invention as set forth in claim 10 wherein said means for operating said gate means which is connected to the output of said summing means is a NAND gate having a plurality of inputs connected separately to different ones of said comparator means, and the output of said NAND gate being connected to enable said gate means which is connected to the output of said summing means in the presence of an output from at least one of said comparator means.

12. The invention as set forth in claim 7 further comprising means for delaying the provision of said fundamental frequency component from said summing means for an interval of time after said wave is applied to the inputs of said channels.

13. The invention as set forth in claim 1 wherein each of said channels has fundamental frequency extraction means operative over a different one of said bands, said extraction means comprising a half-wave rectifier and low pass filter circuit, the cutoff frequency thereof being the highest frequency of said band, said circuit comprising an operational amplifier having direct and inverting inputs and an output, means for connecting one of said inputs to receive said wave, a feedback loop including a diode connected between said output and the other of said inputs, and a first resistor connected in parallel with a capacitor through a second resistor, and first resistor also being connected to said feedback loop, said first resistor and capacitor having values which define a low pass filter cutoff frequency equal to said last-named cutoff frequency.

* * * * *